United States Patent
Abraham et al.

(10) Patent No.: US 10,629,797 B2
(45) Date of Patent: Apr. 21, 2020

(54) TWO-COMPONENT BUMP METALLIZATION

(71) Applicant: International Business Machines Corporation, Armonk, NY (US)

(72) Inventors: David W. Abraham, Croton, NY (US); John M. Cotte, New Fairfield, CT (US); Eric P. Lewandowski, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/233,852

(22) Filed: Dec. 27, 2018

(65) Prior Publication Data

US 2019/0131510 A1    May 2, 2019

Related U.S. Application Data

(63) Continuation of application No. 15/721,238, filed on Sep. 29, 2017.

(51) Int. Cl.
*H01L 27/18* (2006.01)
*H01L 39/04* (2006.01)
(Continued)

(52) U.S. Cl.
CPC ............ *H01L 39/045* (2013.01); *H01L 24/05* (2013.01); *H01L 24/11* (2013.01); *H01L 24/13* (2013.01);
(Continued)

(58) Field of Classification Search
CPC ....... H01L 39/04; H01L 39/045; H01L 39/24; H01L 39/249; H01L 39/2493;
(Continued)

(56) References Cited

U.S. PATENT DOCUMENTS

| 5,255,158 A | 10/1993 | Kosugi |
| 5,773,875 A | 6/1998 | Chan |

(Continued)

FOREIGN PATENT DOCUMENTS

| FR | 2984602 A1 | 6/2013 |
| JP | 0312941 A | 1/1991 |

(Continued)

OTHER PUBLICATIONS

Aliane. Developpement de bolometre refroidi a 0, 1 K pour une detection X dans la gamme 100 eV-10 keV. These 6 pour obtenir le grade de docteur de l'Institut Polytechnique de Grenoble; These l'Institut Polytechnique de Grenoble, Jun. 25, 2009, 207 pages.

(Continued)

*Primary Examiner* — Monica D Harrison
(74) *Attorney, Agent, or Firm* — Erik K. Johnson

(57) ABSTRACT

A structure has a first substrate bonded to a first under-bump metallization (UBM) structure, the first UBM structure comprising a first bonding region laterally surrounded by a first superconducting region. A second substrate is bonded to a second under-bump metallization (UBM) structure, the second UBM structure comprising a second bonding region laterally surrounded by a second superconducting region; and a superconducting solder material joins the first UBM structure to the second UBM structure.

20 Claims, 17 Drawing Sheets

(51) Int. Cl.
*H01L 23/00* (2006.01)
*H01L 39/24* (2006.01)

(52) U.S. Cl.
CPC .............. *H01L 24/16* (2013.01); *H01L 24/81* (2013.01); *H01L 27/18* (2013.01); *H01L 39/2493* (2013.01); *H01L 2224/0401* (2013.01); *H01L 2224/056* (2013.01); *H01L 2224/05015* (2013.01); *H01L 2224/0558* (2013.01); *H01L 2224/05076* (2013.01); *H01L 2224/05139* (2013.01); *H01L 2224/05144* (2013.01); *H01L 2224/05163* (2013.01); *H01L 2224/05164* (2013.01); *H01L 2224/05166* (2013.01); *H01L 2224/05169* (2013.01); *H01L 2224/05173* (2013.01); *H01L 2224/05176* (2013.01); *H01L 2224/05178* (2013.01); *H01L 2224/05187* (2013.01); *H01L 2224/05576* (2013.01); *H01L 2224/05578* (2013.01); *H01L 2224/05639* (2013.01); *H01L 2224/05644* (2013.01); *H01L 2224/05664* (2013.01); *H01L 2224/05669* (2013.01); *H01L 2224/05673* (2013.01); *H01L 2224/05676* (2013.01); *H01L 2224/05678* (2013.01); *H01L 2224/1181* (2013.01); *H01L 2224/11462* (2013.01); *H01L 2224/11849* (2013.01); *H01L 2224/13023* (2013.01); *H01L 2224/13026* (2013.01); *H01L 2224/13109* (2013.01); *H01L 2224/16145* (2013.01); *H01L 2224/81203* (2013.01)

(58) Field of Classification Search
CPC ......... H01L 24/11; H01L 24/13; H01L 24/16; H01L 24/81; H01L 27/18
USPC .......................................................... 257/31
See application file for complete search history.

(56) References Cited

U.S. PATENT DOCUMENTS

| | | | |
|---|---|---|---|
| 5,847,929 A | 12/1998 | Bernier | |
| 5,877,560 A | 3/1999 | Wen | |
| 6,216,941 B1 | 4/2001 | Yokoyama | |
| 6,239,703 B1 | 5/2001 | Friedman | |
| 6,678,540 B2 | 1/2004 | Wire | |
| 7,075,171 B2 | 7/2006 | Hato | |
| 8,159,825 B1 | 4/2012 | Dotsenko | |
| 8,338,286 B2 | 12/2012 | Perfecto | |
| 8,508,043 B2 | 8/2013 | Daubenspeck | |
| 8,871,631 B2 | 10/2014 | Lamprecht | |
| 9,836,699 B1 | 12/2017 | Rigetti | |
| 9,971,970 B1 | 5/2018 | Rigetti | |
| 10,068,181 B1 | 9/2018 | Rigetti | |
| 10,199,553 B1 | 2/2019 | Oliver | |
| 2009/0072393 A1* | 3/2009 | Bachman | H01L 24/03 257/737 |
| 2010/0163292 A1 | 7/2010 | Tsai | |
| 2010/0187688 A1* | 7/2010 | Hochstenbach | H01L 23/3114 257/738 |
| 2014/0246763 A1 | 9/2014 | Bunyk | |
| 2017/0133336 A1 | 5/2017 | Oliver | |
| 2017/0365574 A1 | 12/2017 | Abraham | |
| 2017/0373044 A1 | 12/2017 | Das | |
| 2018/0012932 A1 | 1/2018 | Oliver | |
| 2018/0102470 A1 | 4/2018 | Das | |
| 2019/0103542 A1 | 4/2019 | Abraham | |

FOREIGN PATENT DOCUMENTS

| | | |
|---|---|---|
| JP | 08204244 A | 8/1996 |
| WO | 2017079417 A1 | 5/2017 |
| WO | 2017105524 A1 | 6/2017 |
| WO | 2017131831 A2 | 8/2017 |

OTHER PUBLICATIONS

D. K. Brock, "RSFQ technology: Circuits and systems." International Journal of High Speed Electronics and Systems, vol. 11, No. 01, 2001, pp. 307-362.

IBM: List of IBM Patents or Patent Applications Treated as Related (Appendix P), Sep. 23, 2019, 2 pages.

K. E. Yokoyama et al., "Robust superconducting die attach process." IEEE Transactions on Applied Superconductivity, vol. 7, No. 2, 1997, pp. 2631-2634.

\* cited by examiner

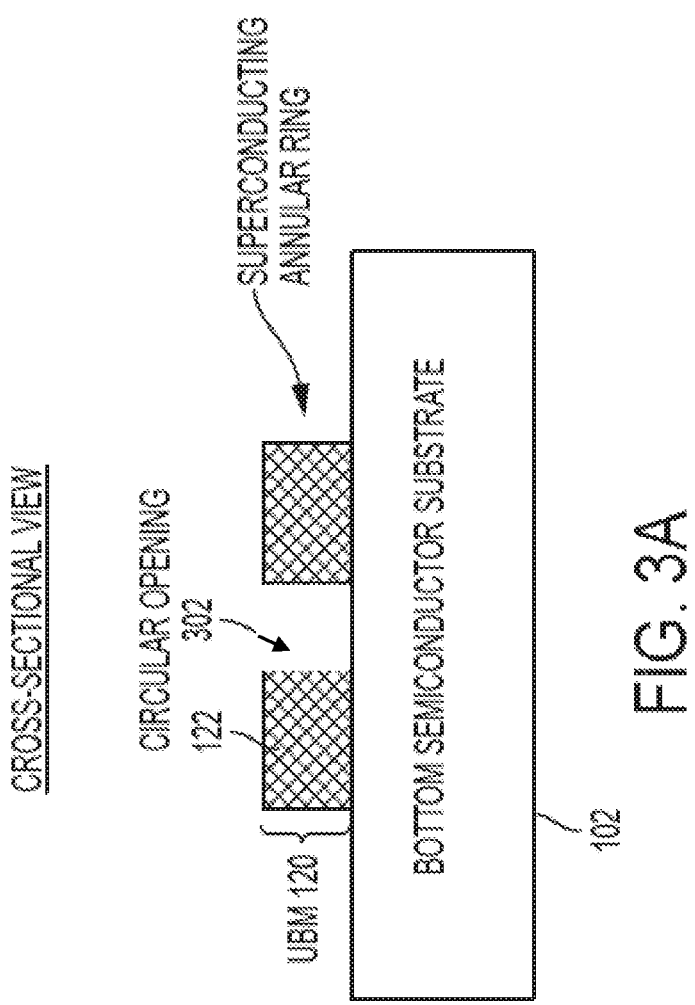

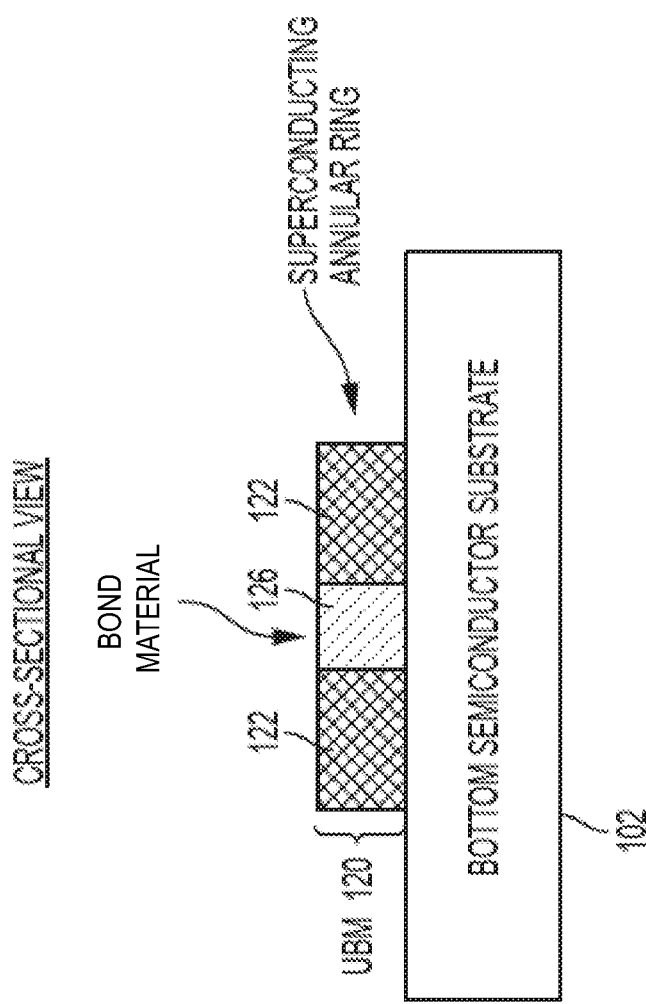

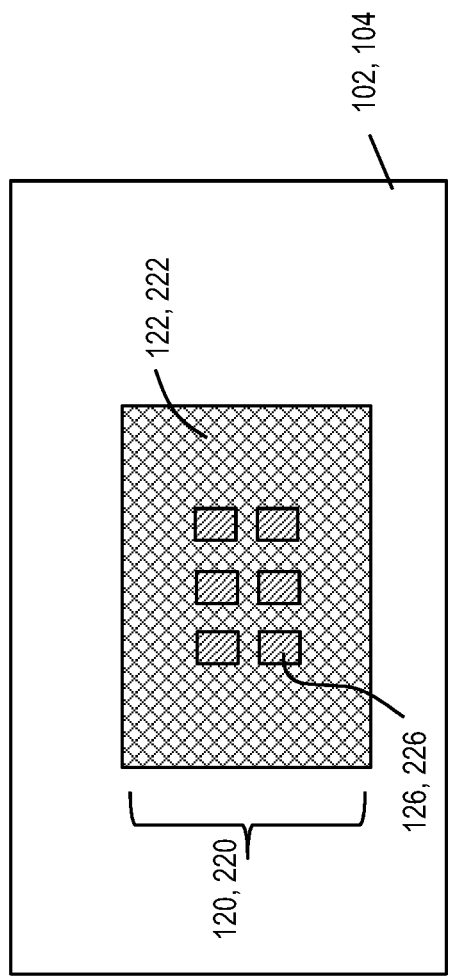

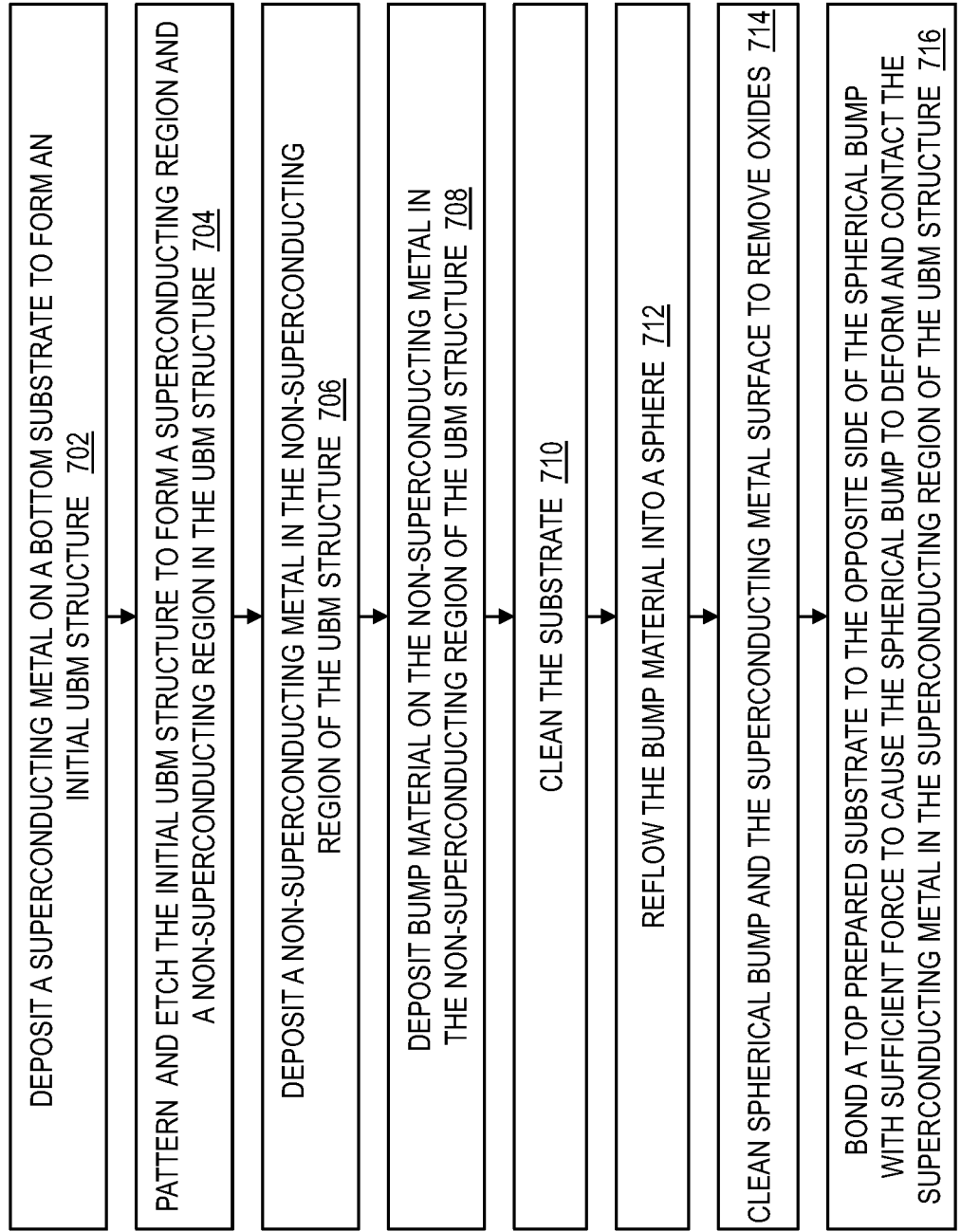

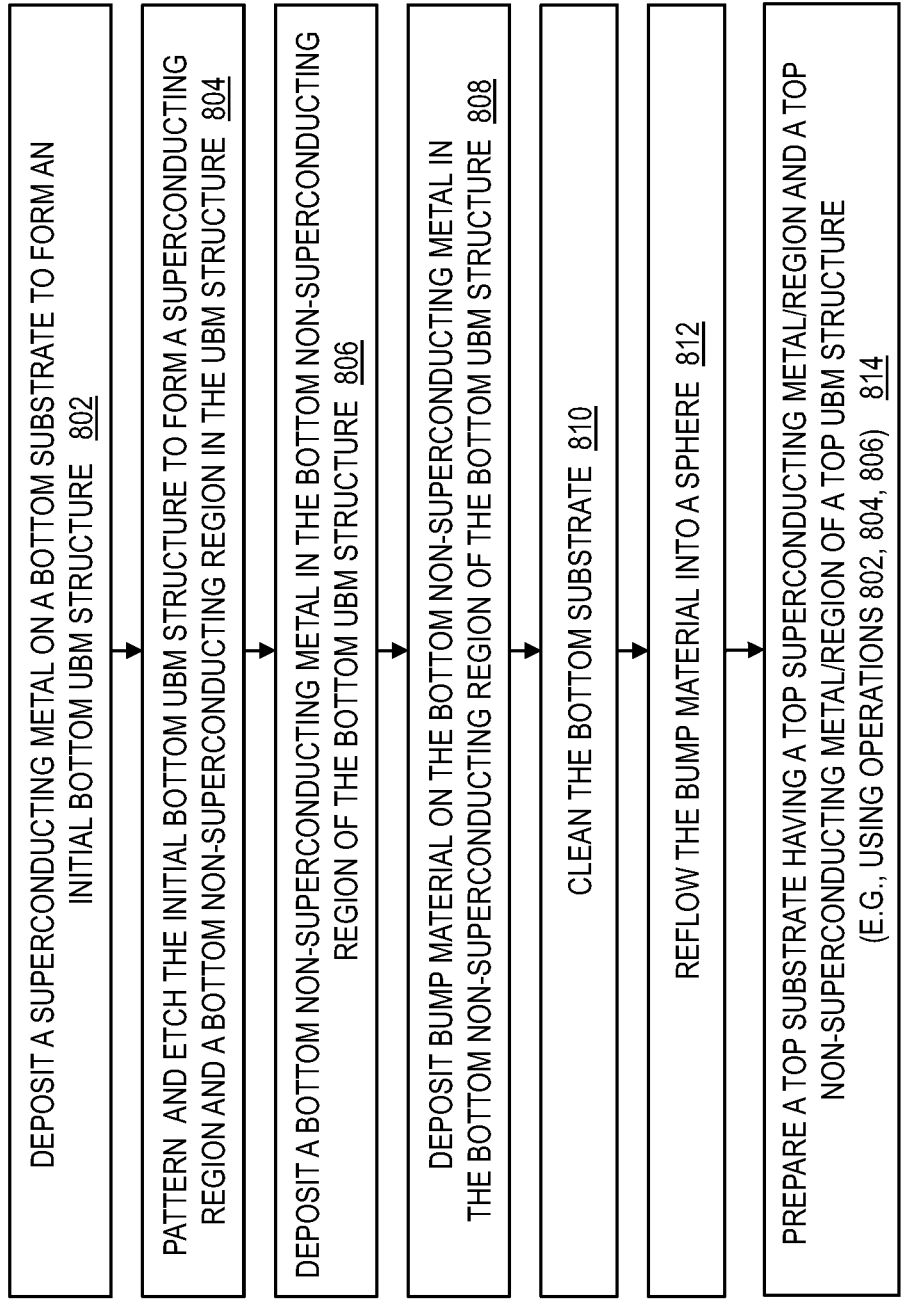

CLEAN SPHERICAL BUMP, TOP AND BOTTOM SUPERCONDUCTING METAL SURFACES, AND TOP AND BOTTOM NON-SUPERCONDUCTING SURFACES TO REMOVE OXIDES 816

BOND THE TOP PREPARED SUBSTRATE AND THE TOP UBM STRUCTURE TO THE OPPOSITE SIDE OF THE SPHERICAL BUMP WITH SUFFICIENT FORCE TO CAUSE THE SPHERICAL BUMP TO DEFORM AND CONTACT THE TOP AND BOTTOM SUPERCONDUCTING METAL IN THE TOP AND BOTTOM SUPERCONDUCTING REGIONS OF THE TOP AND BOTTOM UBM STRUCTURES 818

→ PROVIDE AN UNDER-BUMP-METALLIZATION (UBM) STRUCTURE COMPRISING A FIRST REGION AND A SECOND REGION, THE FIRST AND SECOND REGIONS BEING LATERALLY POSITIONED IN THE UBM STRUCTURE, WHEREIN THE FIRST REGION COMPRISES A SUPERCONDUCTING MATERIAL 902

→ PROVIDE A SUBSTRATE OPPOSING THE UBM STRUCTURE 904

→ JOIN THE SUBSTRATE TO THE FIRST REGION AND TO THE SECOND REGION WITH A SUPERCONDUCTING SOLDER MATERIAL 906

PROVIDE A FIRST UNDER-BUMP-METALLIZATION (UBM) STRUCTURE COMPRISING A FIRST REGION AND A SECOND REGION, THE FIRST AND SECOND REGIONS BEING LATERALLY POSITIONED IN THE FIRST UBM STRUCTURE, THE FIRST UBM STRUCTURE BEING CONNECTED TO A FIRST SUBSTRATE  1002

→

PROVIDE A SECOND UBM STRUCTURE COMPRISING ANOTHER FIRST REGION AND ANOTHER SECOND REGION, THE ANOTHER FIRST AND ANOTHER SECOND REGIONS BEING LATERALLY POSITIONED IN THE SECOND UBM STRUCTURE, THE SECOND UBM STRUCTURE BEING CONNECTED TO A SECOND SUBSTRATE  1004

→

JOIN THE FIRST REGION AND THE SECOND REGION OF THE FIRST UBM STRUCTURE TO THE ANOTHER FIRST REGION AND THE ANOTHER SECOND REGION OF THE SECOND UBM STRUCTURE WITH A SUPERCONDUCTING SOLDER MATERIAL JOINING, WHEREIN THE FIRST REGION AND THE ANOTHER FIRST REGION COMPRISE SUPERCONDUCTING MATERIAL  1006

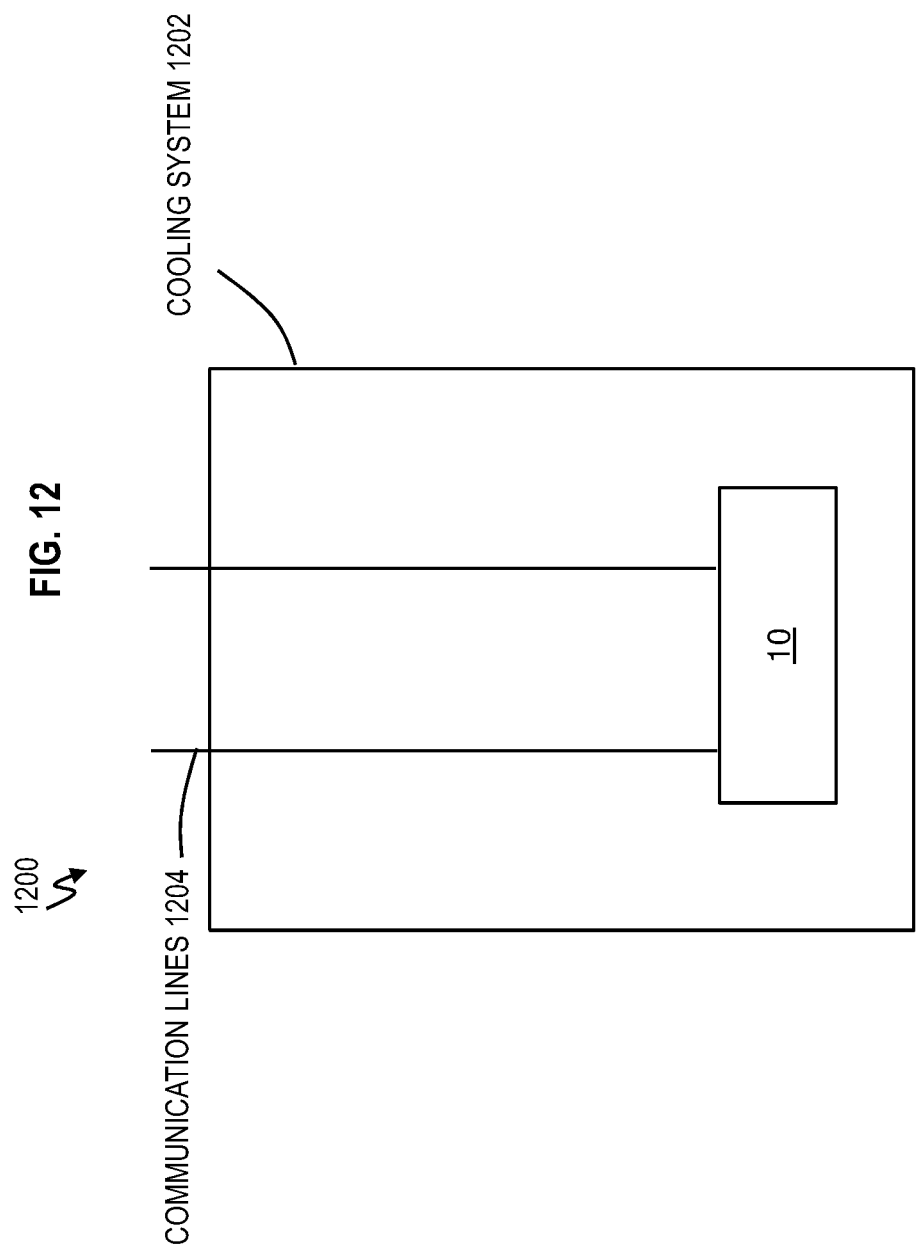

TWO-COMPONENT BUMP METALLIZATION

BACKGROUND

The present invention relates in general to coupling electronic signals into and out of an integrated circuit (IC). More specifically, the present invention relates to systems, fabrication methodologies and resulting bump metallization structures which provide superconducting electrical coupling and secure mechanical adhesion between a bump and the metallization structure.

Semiconductor devices are used in a variety of electronic and electro-optical applications. ICs are typically formed from various circuit configurations of semiconductor devices formed on semiconductor wafers. Alternatively, semiconductor devices can be formed as monolithic devices, e.g., discrete devices. Semiconductor devices are formed on semiconductor wafers by depositing many types of thin films of material over the semiconductor wafers, patterning the thin films, doping selective regions of the semiconductor wafers, etc.

In a conventional semiconductor fabrication process, a large number of semiconductor devices are fabricated in a single wafer. CMOS (complementary metal-oxide semiconductor) is the semiconductor fabrication technology used to form the transistors that are manufactured into most of today's computer microchips. In CMOS technology, both n-type and p-type transistors are used in a complementary way to form a current gate that forms an effective means of electrical control. Processing operations performed later in CMOS technology fabrication sequences are referred to as back-end-of-line (BEOL) CMOS processing, and processing steps performed earlier in CMOS technology fabrication sequences are referred to as front-end-of-line (FEOL) CMOS processing.

After completion of device level and interconnect level fabrication processes, the semiconductor devices on the wafer are separated into micro-chips (i.e., chips), and the final product is packaged. IC (or chip) packaging typically involves encasing the silicon chip(s) inside a hermetically sealed plastic, metal or ceramic package that prevents the chip(s) from being damaged by exposure to dust, moisture or contact with other objects. IC packaging also allows easier connections to a PCB. The purpose of a PCB is to connect ICs and discreet components together to form larger operational circuits. Other parts that can be mounted to the PCB include card sockets, microwave connectors, and the like.

Wire bonding is a known BEOL operation for forming electrical interconnections between a PCB and other components (e.g., external components, card sockets, microwave connectors, chip carriers, etc.). In wire bonding, a length of small diameter soft metal wire (e.g., gold (Au), copper (Cu), silver (Ag), aluminum (Al), and the like) is attached or bonded without the use of solder to a compatible metallic surface or pad mounted on a PCB. The actual bond between the wire and the pad can be formed in a variety of ways, including the use of thermo-compression, thermo-sonic and ultrasonic techniques. Although wire bonding is widely used, the additional wire bond hardware, particularly in microwave/radio frequency (RF) applications, is manually intensive to fabricate, suffers from low temperature CTE (coefficient of thermal expansion) mismatches, is difficult to reliably repeat, causes signal path problems, increases cost, adds bulk and introduces extraneous microwave cavity modes.

So called "flip chip" assembly methodologies provide an alternative to wire bonding. Flip Chip assembly is the direct electrical connection of face-down (i.e., flipped) electronic die onto organic or ceramic circuit boards by means of conductive bumps on the chip bond pads, which are also known as "under bump metallization" (UBM). The conductive bumps can be formed as small spheres of solder (i.e., solder balls), which are bonded to contact areas or pads of semiconductor devices. A conventional flip chip assembly methodology can include placing solder material on a semiconductor chip/substrate, flipping the chip over, aligning the solder with the contact pads (i.e., UBM) on the chip, and re-flowing the solder in a furnace to form the solder into spherical shapes and establish the bonding between the solder bumps, the UBM and the chip. Flip chip assembly methodologies can provide electrical connections with minute parasitic inductances and capacitances. In addition, the contact pads (i.e., UBMs) are distributed over the entire chip surface rather than being confined to the periphery, as in wire bonding. As a result, the chip area is used more efficiently, the maximum number of interconnects is increased, and signal interconnections are shortened. Accordingly, flip chip assembly methodologies have advantages over traditional face-up wire bonding techniques including real-estate utilization, performance, reliability, and cost.

For chip configurations in which bump bonds carry electronic data and other signals into and out of a chip, it can be desirable to minimize signal loss from the electronic data and other signals that are carried across bump bonds. One method of minimizing such signal loss is to configure the bump/UBM interface to be fully superconductive. In general, superconductivity is the ability of certain materials to conduct electric current with practically zero resistance.

In many cases, the bump metal of choice is indium or indium alloys, with the material deposited in various ways onto a compatible UBM film stack. Because the thick indium-based bump metal is deposited in a separate process from the UBM films, certain constraints are placed on the composition of the UBM film. In particular, the top surface of the UBM should not be oxidized during indium deposition/plating in order to form a good bond between the indium alloy and the UBM. As a result, it can be desirable to use materials which form strong adhesion to the UBM stack. Materials which form such a mechanical bond may well not form a superconducting connection (and in fact may not even provide an electrical contact). For example, noble metal on the UBM films can provide superior mechanical/metallic connections because little to no oxide is present on the noble metal surface, while possibly not providing a superconducting contact. Noble metals are particularly attractive to provide a mechanical bond because the level of oxidation on the surface of noble metals, even in a moist environment, is very low.

SUMMARY

Embodiments of the invention are directed to a structure. A non-limiting example of the structure includes an under-bump-metallization (UBM) structure comprising a first region and a second region, the first and second regions being laterally positioned in the UBM structure, where the first region comprises a superconducting material. The structure includes a substrate opposing the UBM structure and a superconducting solder material joining the first region to the substrate and the second region to the substrate.

Embodiments of the invention are directed to a structure. A non-limiting example of the structure includes a first under-bump-metallization (UBM) structure comprising a first region and a second region, the first and second regions being laterally positioned in the first UBM structure, the first UBM structure being connected to a first substrate. The structure includes a second UBM structure comprising another first region and another second region, the another first and another second regions being laterally positioned in the second UBM structure, the second UBM structure being connected to a second substrate. Also, the structure includes a superconducting solder material joining the first region and the second region of the first UBM structure to the another first region and the another second region of the second UBM structure, where the first region and the another first region comprise superconducting material.

Embodiments of the invention are directed to a system. A non-limiting example of the system includes a device. The device includes an under-bump-metallization (UBM) structure comprising a first region and a second region, the first and second regions being laterally positioned in the UBM structure, wherein the first region comprises a superconducting material. The device includes a substrate opposing the UBM structure and a superconducting solder material joining the first region to the substrate and the second region to the substrate. Also, the system includes a cooling system configured to reduce a temperature to a superconducting temperature associated with the device.

Embodiments of the invention are directed to a method of forming a device. A non-limiting example of the method includes providing an under-bump-metallization (UBM) structure comprising a first region and a second region, the first and second regions being laterally positioned in the UBM structure, where the first region comprises a superconducting material. The method includes providing a substrate opposing the UBM structure and joining the substrate to the first region and to the second region with a superconducting solder material.

Embodiments of the invention are directed to method of forming a device. A non-limiting example of the method includes providing a first under-bump-metallization (UBM) structure comprising a first region and a second region, the first and second regions being laterally positioned in the first UBM structure, the first UBM structure being connected to a first substrate. The method includes providing a second UBM structure comprising another first region and another second region, the another first and another second regions being laterally positioned in the second UBM structure, the second UBM structure being connected to a second substrate. Also, the method includes joining the first region and the second region of the first UBM structure to the another first region and the another second region of the second UBM structure with a superconducting solder material joining, where the first region and the another first region comprise superconducting material.

Additional features and advantages are realized through the techniques described herein. Other embodiments and aspects are described in detail herein. For a better understanding, refer to the description and to the drawings.

BRIEF DESCRIPTION OF THE DRAWINGS

The subject matter which is regarded as the present invention is particularly pointed out and distinctly claimed in the claims at the conclusion of the specification. The foregoing and other features and advantages are apparent from the following detailed description taken in conjunction with the accompanying drawings in which:

FIG. 3A depicts a cross-sectional view of a UBM structure after a fabrication operation according to embodiments of the invention;

FIG. 4A depicts a cross-sectional view of a UBM structure after a fabrication operation according to embodiments of the invention;

FIG. 6B depicts a top-down view of the bottom/top two-component UBM structure according to embodiments of the invention;

FIG. 7 depicts a method of forming a two-component UBM structure to be bonded with a substrate according to embodiments of the invention;

FIG. 8A depicts a method of forming top and bottom two-component UBM structures to be bond top and bottom substrates according to embodiments of the invention;

FIG. 8B continues the method of forming top and bottom two-component UBM structures to be bond top and bottom substrates according to embodiments of the invention;

FIG. 9 depicts a flow chart of forming a device according to embodiments of the invention;

FIG. 10 depicts a flow chart of forming a device according to embodiments of the invention;

FIG. 12 depicts a system according to embodiments of the invention.

Figure 1:
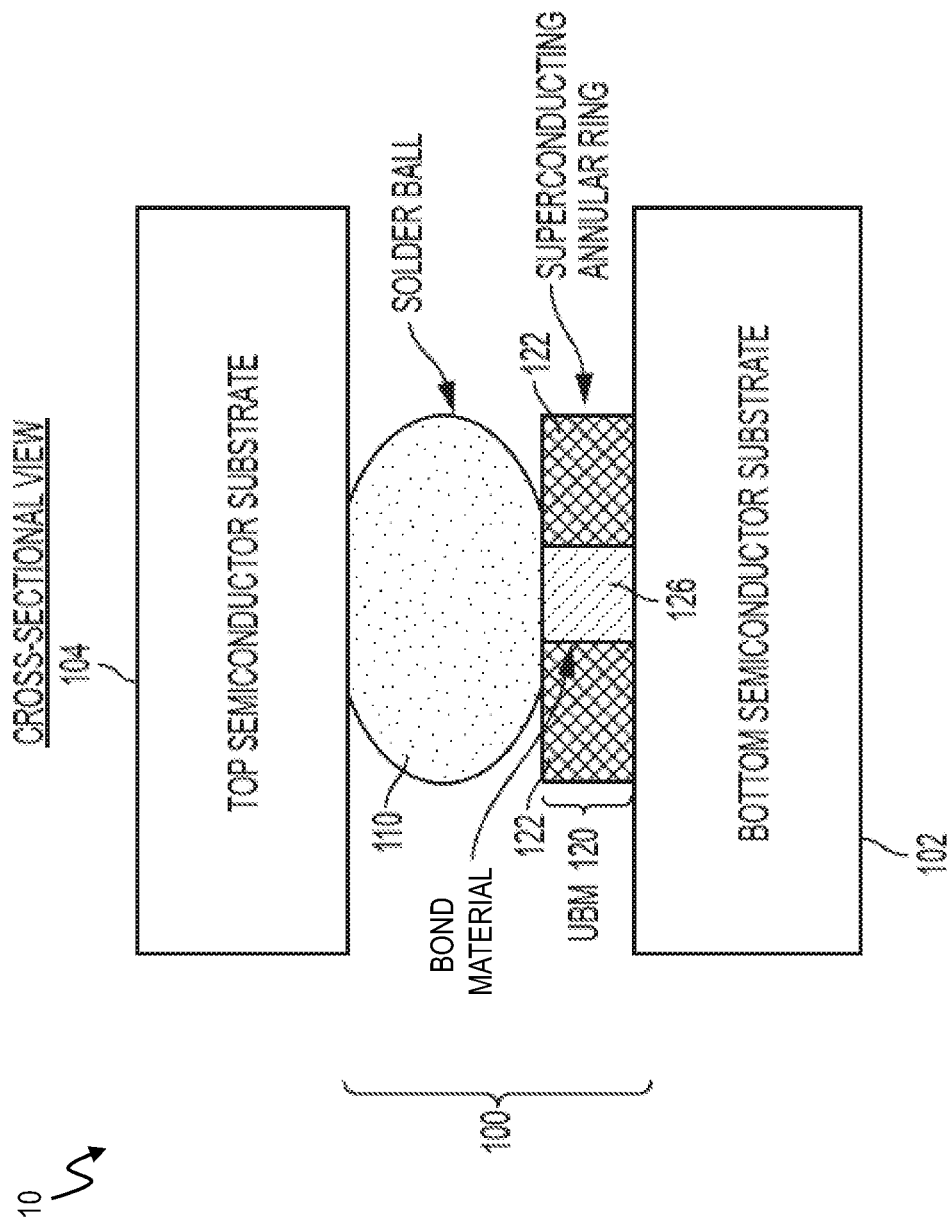
FIG. 1 depicts a cross-sectional view of a two-component UBM structure according to embodiments of the invention.

In the accompanying figures and following detailed description of the disclosed embodiments, the various elements illustrated in the figures are provided with three or four digit reference numbers. The leftmost digit(s) of each reference number corresponds to the figure in which its element is first illustrated.

DETAILED DESCRIPTION

It is understood in advance that, although this detailed description includes a description of attaching a specific type of microwave connector to interconnect metallurgy on a silicon wafer/chip, implementation of the teachings recited herein are not necessarily limited to a particular type of connector or transmission architecture. Rather embodiments of the present invention are capable of being implemented in conjunction with any other type of connector or transmission architecture, now known or later developed.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the described embodiments of the present invention are not intended to be limiting in this respect. Accordingly, a coupling of entities can refer to either a direct or an indirect coupling, and a positional relationship between entities can be a direct or indirect positional relationship. As an example of an indirect positional relationship, references in the detailed description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (i.e., rotated 90 degrees or at other orientations), and the spatially relative descriptors used herein should be interpreted accordingly.

For the sake of brevity, conventional techniques related to semiconductor device and IC fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

As previously noted herein, after completion of device level and interconnect level fabrication processes, the semiconductor devices on the wafer are separated into microchips (i.e., chips), and the final products is packaged. IC packaging typically involves encasing the silicon chip(s) inside a hermetically sealed plastic, metal or ceramic package that prevents the chip(s) from being damaged by exposure to dust, moisture or contact with other objects. IC packaging also allows easier connections to a PCB. The purpose of a PCB is to connect ICs and discreet components together to form larger operational circuits. Other parts that can be mounted to the PCB include card sockets, microwave connectors, and the like.

Wire bonding is a known BEOL operation for forming electrical interconnections between a PCB and other components (e.g., external components, card sockets, microwave connectors, etc.). In wire bonding, a length of small diameter soft metal wire (e.g., Au, Cu, Ag, Al, and the like) is attached or bonded with the use of solder to a compatible metallic surface or pad mounted on a PCB. The actual bond between the wire and the pad can be formed in a variety of ways, including thermo-compression, thermo-sonic and ultrasonic techniques. Although wire bonding is widely used, the additional wire bond hardware, particularly in microwave/RF applications, is manually intensive to fabricate, suffers from low temperature CTE mismatches, is difficult to reliably repeat, causes signal path problems, increases cost, adds bulk and introduces extraneous microwave cavity modes.

As previously described, so called "flip chip" assembly methodologies provide an alternative to wire bonding. Flip Chip assembly is the direct electrical connection of face-down (i.e., flipped) electronic die onto organic or ceramic circuit boards by means of conductive bumps on the chip bond pads, which are also known as "under bump metallization" (UBM). The conductive bumps can be formed as small spheres of solder (i.e., solder balls), which are bonded to contact areas or pads of semiconductor devices. Flip chip assembly methodologies have advantages over traditional face-up wire bonding techniques including real-estate utilization, performance, reliability, and cost.

For chip configurations in which bump bonds carry electronic data and other signals into and out of a chip, it can be desirable to minimize signal loss from the electronic data and other signals that are carried across bump bonds. One method of minimizing such signal loss is to configure the bump/UBM connection into or from the chip such that the connection is fully superconducting. It can also be desirable to have strong mechanical/metallic adhesion between the bump/UBM and the chips. A strong adhesion can be achieved by forming the UBM from a noble metal, which can provide superior mechanical/metallic connections because little to no oxide is present on the noble metal UBM surface.

Turning now to an overview of aspects of the present invention, embodiments of the invention provide systems, methodologies and resulting UBM structures that are fully superconducting and provide superior mechanical/metallic bonding. According to embodiments of the invention, the UBM includes two components/regions, namely, a bonding component/region and a conductive component/region. The bonding region is electrically coupled and mechanically bonded to a solder bump, and the conductive region is also electrically coupled and mechanically bonded to the solder bump.

According to embodiments of the invention, the mechanical bond provided by the bonding region is superior to the mechanical bond provided by the conductive region. Accordingly, the overall mechanical bond provided by the novel UBM structure (i.e., the conductive region and the bonding region) is a superior mechanical bond. In embodiments of the invention, the mechanical bond provided by the bonding region is improved over the mechanical bond provided by the conductive region by forming the bond region from a material that resists oxidation. Accordingly, in embodiments of the invention, the bond region is formed from a material having a lower level of surface oxidation than the material that forms the conductive region.

In embodiments of the invention, the mechanical bond between the bonding region and the solder bump is a metallic bond, which can be defined (in one case) as the bonding that results from the attraction between metal ions and a "surrounding sea" of electrons. One way to measure the strength of metallic bonding provided by a given material is that material's enthalpy (heat) of vaporization. The enthalpy of vaporization ($\Delta H_{vap}$), also known as the heat of vaporization or heat of evaporation, is the energy required to transform a given quantity of a substance into a gas. In general, a metal having a higher enthalpy of vaporization than another metal means that the metal having the higher enthalpy of vaporization can form a stronger metallic bond.

According to embodiments of the invention, the bonding region is formed from materials having a higher enthalpy of vaporization than the materials that form the conductive region.

In embodiments of the invention, the bonding region is formed from a noble metal that is non-superconducting. In chemistry, the noble metals are metals that are resistant to corrosion and oxidation in moist air (unlike most base metals). Chemically noble metals include ruthenium, rhodium, palladium, silver, osmium, iridium, platinum, and gold. The bonding region can be formed from a stack having multiple layers, which can, in some embodiments of the invention, be selected from the group consisting of titanium ($\Delta$Hvap=425 KJ/mol), palladium ($\Delta$Hvap=380 KJ/mol), and gold ($\Delta$Hvap=330 KJ/mol). In embodiments of the invention, the exposed surface layer of the bonding region is wettable to improve contact between the bonding region and the solder bump.

According to embodiments of the invention, the electrical coupling provided by the conductive region is superior to the electrical coupling provided by the bonding region. One way to measure electrical coupling is resistance. In embodiments of the invention, the conductive region is formed from materials having lower electrical resistance than the materials that form the bonding region. Importantly, the connection between the bump and the conductive region of the UBM is lower resistance as well, distinguishing between the resistance of either the bump or conductive region material themselves. Accordingly, the overall electrical coupling provided by the novel UBM structure (i.e., the conductive region and the bonding region) is superior, low resistance electrical coupling.

In embodiments of the invention, the conductive region is formed from a material having superconductivity properties. Superconductivity is the ability of certain materials to conduct electric current with practically zero resistance. For a material to behave as a superconductor, low temperatures (e.g., in the single digit Kelvin range or up to temperatures in the range of 100 K or even higher) are required. The conductive region can be formed from a superconducting metal, which can, in some embodiments of the invention, be selected from the group consisting of tantalum, aluminum, and other similar superconducting metals. The conductive region can be formed from a superconducting ceramic, which can, in some embodiments of the invention, be titanium nitride, or any and other similar superconducting ceramics.

In embodiments of the invention, the surface area of the bump/UBM interface can be selectively and dynamically allocated between the bond region and the conductive region in order to achieve the desired bonding properties and electrical coupling properties. For example, it can be seen that, based on the chosen bump/UBM materials, superconductivity is provided between the bump/UBM interface in the conductive region. For superconductivity, there should be contact reliability between the bump and UBM materials, and larger bump/UBM interface areas will work more of the time; considerations for the bump/UBM interface may include that it is a) large enough to be superconducting which is a coherence length size scale of this order, b) large enough to avoid inductance effects by having too fine a wire, and/or c) large enough to allow sufficient current-carrying capacity. In this situation, the surface area of the bump/UBM interface can be selectively and dynamically allocated to provide 20% of the bump/UBM interface area to the conductive region and 80% of the bump/UBM interface area to the bond region. In another example, it can be determined that, based on the chosen bump/UBM materials, sufficient bump/UBM adhesion is provided by allocating 60% of the bump/UBM interface area to the bond region. In this situation, the surface area of the bump/UBM interface can be selectively allocated to provide 60% of the bump/UBM interface area to the bond region and 40% of the bump/UBM interface area to the conductive region.

Embodiments of the invention provide novel fabrication methodologies for forming the two-component UBM and attaching the UBM to the bump such that the bump contacts the bonding region and the conductive region of the UBM structure. In embodiments of the invention, the bonding region is formed as a circle to match the spherical contour of the bump, and the conductive region is formed as an annular ring around the circular bonding region (in one case). During fabrication, initial contact is made between the bump and the circular bonding region, and the bump is subsequently compressed (e.g., during a thermo-compression bonding operation) using sufficient force to cause the bump to deform against the two-component UBM structure enough that the bump/UBM interface, in effect, spreads out, and the deformed bump comes into contact with the annular ring-shaped conductive region of the UBM structure. In embodiments of the invention, the circular bonding region is thinner than the annular ring-shaped conduction region in order to reduce the amount of force needed to bring the deformed bump into contact with the annular ring-shaped conductive region.

Embodiments of the invention can be utilized to provide a bump bond between first and second semiconductor wafers. In such configurations, the bump can be provided with a first two-component UBM at the connection between the bump and the first semiconductor wafer, along with a second two-component UBM at the connection between the bump and the second semiconductor wafer. It is noted that the second two-component UBM can be referred to as a bond metallurgy instead of UBM.

Turning now to a more detailed description of aspects of the invention, FIG. 1 depicts a cross-sectional view of a device 10 which includes a bump/UBM interface 100 having a two-component UBM structure 120 according to embodiments of the invention. The cross-sectional view shown in FIG. 1 depicts a bottom semiconductor wafer/substrate 102, a top semiconductor wafer/substrate 102, a solder ball/bump 110, and a two-component UBM structure 120 having a bonding region 126 (e.g., a non-oxidizing metal) and a conductive region 122 (e.g., a superconducting annular ring), configured and arranged as shown.

The bonding region 126 is electrically coupled and mechanically bonded to the solder ball 110, and the conductive region 122 is also electrically coupled and mechanically bonded to the solder ball 110. According to embodiments of the invention, the mechanical bond provided by the bonding region 126 is superior to the mechanical bond provided by the conductive region 122. Accordingly, the overall mechanical bond provided by the novel UBM structure 120 (i.e., the conductive region 122 and the bonding region 126) is a superior mechanical bond. In embodiments of the invention, the mechanical bond provided by the bonding region 126 is improved over the mechanical bond provided by the conductive region 122 by forming the bonding region 126 from a material that resists oxidation. Accordingly, in embodiments of the invention, the bond region 126 is formed from a material having a lower level of surface oxidation than the material that forms the conductive region 122.

In embodiments of the invention, the mechanical bond between the bonding region 126 and the solder ball 110 is a metallic bond, which can be defined as the chemical bonding that results from the attraction between metal ions and a "surrounding sea" of electrons. One way to measure the strength of metallic bonding provided by a given material is the material's enthalpy (heat) of vaporization. According to embodiments of the invention, the bonding region 126 is formed from materials having a higher enthalpy of vaporization than the materials that form the conductive region 122.

In embodiments of the invention, the bonding region 126 can be formed from a noble metal that is non-superconducting. The bonding region 126 can be formed from a stack having multiple layers, which can, in some embodiments of the invention, be selected from the group consisting of titanium (ΔHvap=425 KJ/mol), palladium (ΔHvap=380 KJ/mol), and gold (ΔHvap=330 KJ/mol). In embodiments of the invention, the exposed surface layer of the bonding region 126 is wettable to improve contact between the bonding region 126 and the solder ball 110.

According to embodiments of the invention, the electrical coupling provided by the conductive region 122 is superior to the electrical coupling provided by the bonding region 126. One way to measure electrical coupling is resistance. In embodiments of the invention, the conductive region 122 is formed from materials having lower electrical resistance than the materials that form the bonding region 126. Accordingly, the overall electrical coupling provided by the novel UBM structure 120 (i.e., the conductive region 122 and the bonding region 126) is superior, low resistance electrical coupling.

In embodiments of the invention, the conductive region 122 is formed from a material having superconductivity properties. The conductive region 122 can be formed from a superconducting metal, which can, in some embodiments of the invention, be selected from the group consisting of titanium nitride, tantalum, aluminum, and other similar superconducting metals.

In embodiments of the invention, the surface area of the bump 110/UBM 120 interface can be selectively and dynamically allocated between the bond region 126 and the conductive region 122 in order to achieve the desired bonding properties and electrical coupling properties. For example, it can be determined that, based on the chosen bump 110/UBM 120 materials, full superconductivity can be provided by allocating at least 20% of the bump 110/UBM 120 interface to the conductive region 122. In this situation, the surface area of the bump 110/UBM 120 interface can be selectively and dynamically allocated to provide 20% of the bump 110/UBM 120 interface area to the conductive region and 80% of the bump 110/UBM 120 interface area to the bond region 126. In another example, it can be determined that, based on the chosen bump 110/UBM 120 materials, sufficient bump 110/UBM 120 adhesion is provided by allocating 60% of the bump 110/UBM 120 interface area to the bond region 126. In this situation, the surface area of the bump 110/UBM 120 interface can be selectively allocated to provide 60% of the bump 110/UBM 120 interface area to the bond region 126 and 40% of the bump 110/UBM 120 interface area to the conductive region 122.

In embodiments of the invention, the bonding region 126 can be formed as a circle (best shown in FIG. 4B) to match the spherical contour of the solder ball 110, and the conductive region 122 can be formed as an annular ring (best shown in FIG. 4B) around the circular bonding region 126. It should be appreciated that there are many different shapes that can be used for the bonding region 126 and the conductive region 122.

During fabrication, initial contact is made between the solder ball 110 and the circular bonding region 126, and the solder ball 110 is subsequently compressed (e.g., during a thermo-compression bonding operation) using sufficient force to cause the solder ball 110 to deform against the two-component UBM 120 enough that the bump 110/UBM 120 interface, in effect, spreads out, and the deformed solder ball 110 comes into contact with the annular ring-shaped conductive region 122 of the UBM 120. In embodiments of the invention, the circular bonding region 126 can be made thinner than the annular ring-shaped conductive region 122 in order to reduce the amount of force needed to bring the deformed solder ball 110 into contact with the annular ring-shaped conductive region 122. Additional details of a fabrication methodology according to embodiments of the invention are provided herein in connection with the methodologies 700, 800 shown in FIGS. 7, 8A, and 8B.

Figure 2:
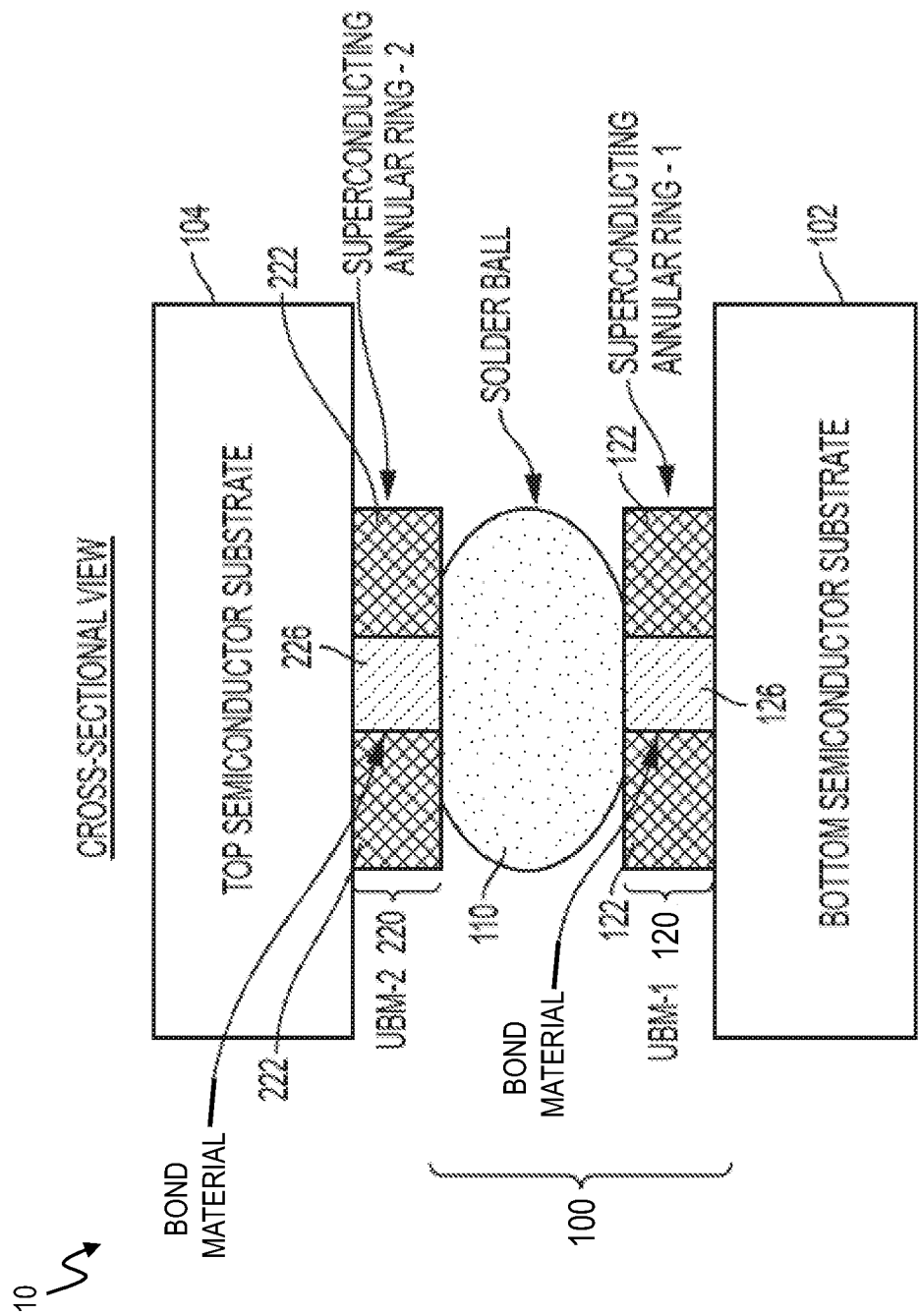
FIG. 2 depicts a cross-sectional view of another two-component UBM structure according to embodiments of the invention.

In some embodiments of the invention, two two-component UBM structures can be provided on opposing sides of the solder ball. FIG. 2 depicts a cross-sectional view of a modified device 10 which includes a bump/UBM interface 100 having a first two-component UBM structure 120 and a second two-component UBM structure 220 according to embodiments of the invention. The first two-component UBM structure 120 and the second two-component UBM structure 220 are substantially the same as the two-component UBM 120 shown in FIG. 1.

A fabrication methodology for forming various stages of the bump/UBM interface 100 according to embodiments of the present invention will now be described with reference to FIGS. 3A-7. More specifically, FIGS. 3A-5B illustrate the bump/UBM interface 100 after various fabrication stages, and FIG. 7 depicts a fabrication methodology 700 that corresponds to the fabrication stages shown in FIGS. 3A-5B. The following description will refer alternatively to the fabrication stages depicted in FIGS. 3A-5B, and the corresponding operation(s) of methodology 700 depicted in FIG. 7. It is noted that the bump/UBM interfaces 100 shown in FIGS. 1, 2, and 3A-5B are greatly simplified for ease of illustration and description. In practice, a bump/UBM interface embodying aspects of the present invention can include multiple configurations of wafers, wafer circuitry, interconnect layers, bond layers and solder layers.

Figure 3B:
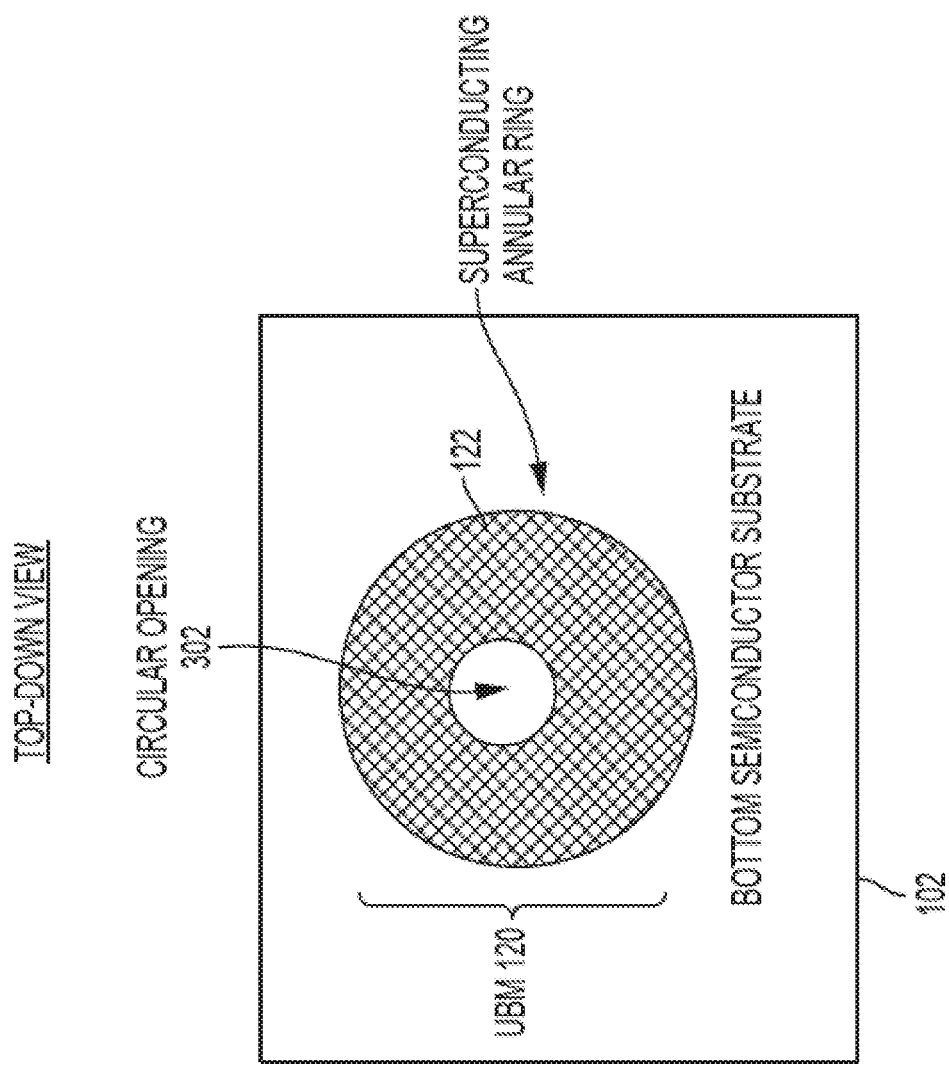
FIG. 3B depicts a top-down view of the UBM structure shown in FIG. 3A.

FIG. 3A depicts a cross-sectional view of the bump/UBM interface 100 after an initial fabrication stage according to embodiments of the invention, and FIG. 3B depicts a top-down view of the bump/UBM interface 100 shown in FIG. 3A. The bump/UBM interface 100 as shown in FIGS. 3A and 3B can be formed by depositing a superconducting metal (e.g., niobium, TiN, Ta, Al, or similar material). The thickness of the superconducting metal can range from about 20 nm to about 400 nm. The superconducting metal can be patterned and etched to form the annular ring-shaped conductive region 122 having a circular opening 302 or any other desired pattern. The annular ring-shaped conductive region 122 can be connected to structures of interest on the bottom semiconductor wafer/substrate 102 through the superconducting metal.

Figure 4B:
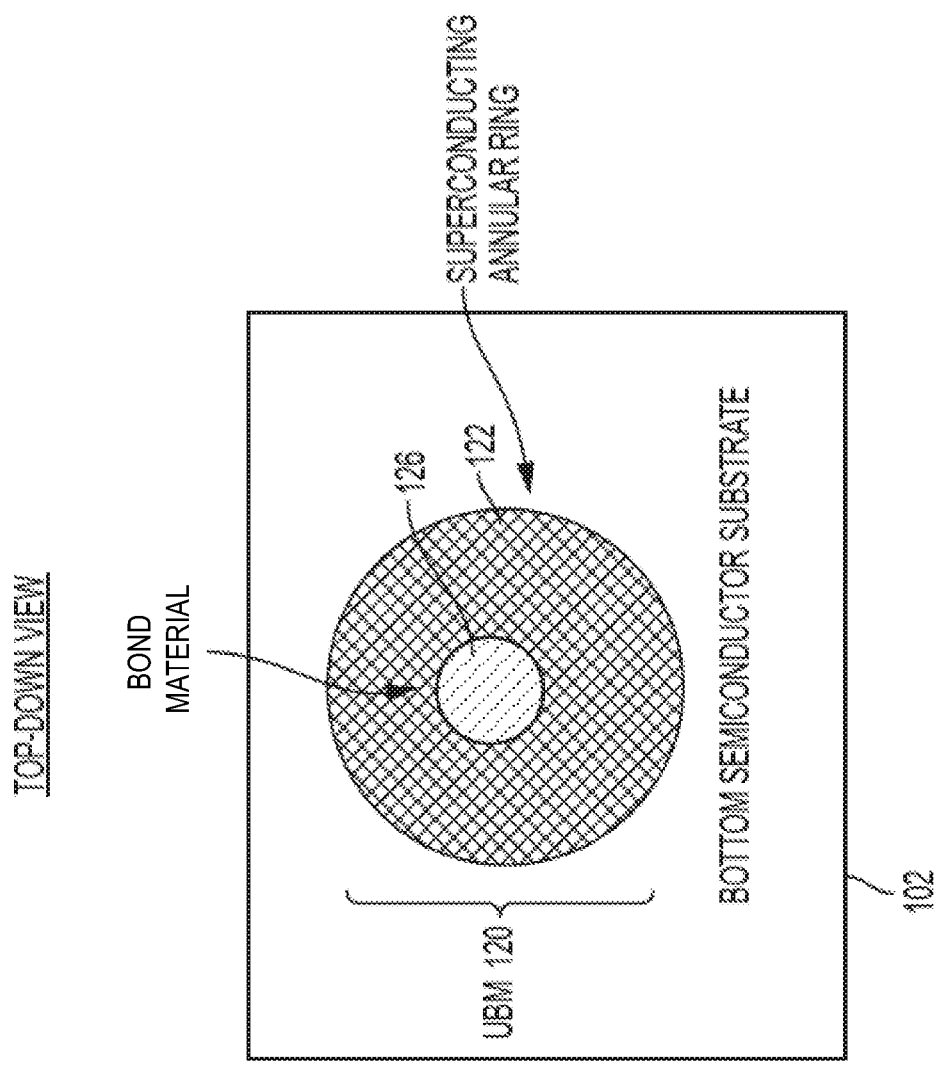
FIG. 4B depicts a top-down view of the UBM structure shown in FIG. 4A.

FIG. 4A depicts a cross-sectional view of the bump/UBM interface 100 after forming the bonding region 126 in the circular opening 302, and FIG. 4B depicts a top-down view of the bump/UBM interface 100 shown in FIG. 4A. In embodiments of the invention, the bonding region 126 can be formed from a non-superconducting, non-oxidizing metal. The bonding region 126 can be formed by using a liftoff resist scheme to deposit the non-superconducting metal into the circular opening 302. In one implementation, the non-superconducting metal in the circular opening 302 can be a Ti/Pd/Au composition/stack, in which the Ti is formed on the bottom substrate, Pd is formed on the Ti, and the Au is formed on the Pd. There can be other stacks of materials used as the non-superconducting metal in the circular opening 302.

Figure 5A:
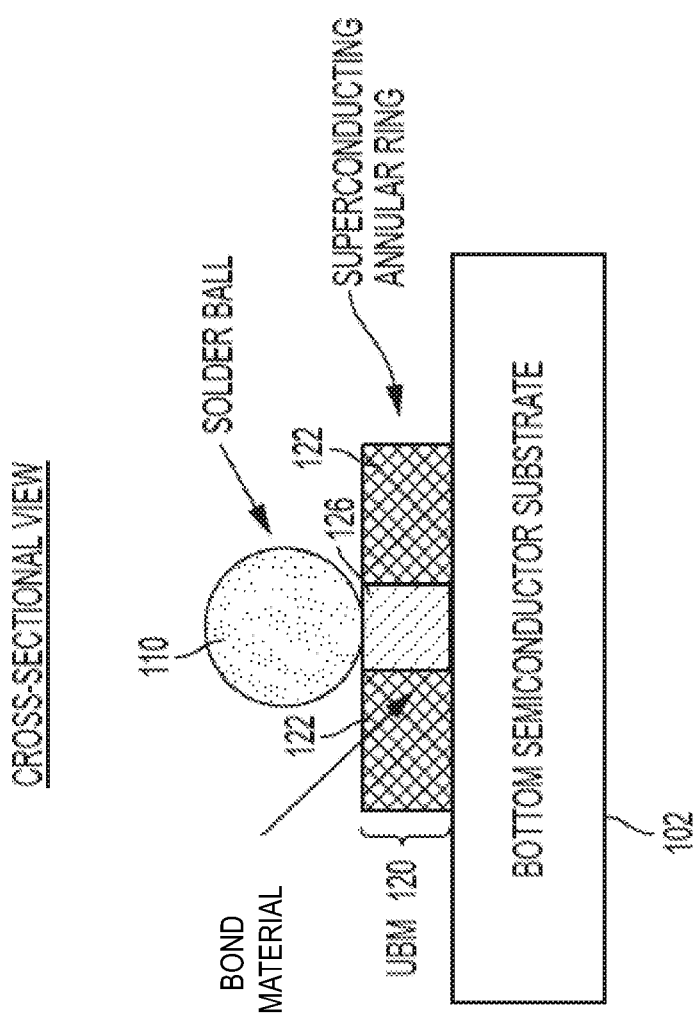
FIG. 5A depicts a cross-sectional view of a UBM structure after a fabrication operation according to embodiments of the invention.
Figure 5B:
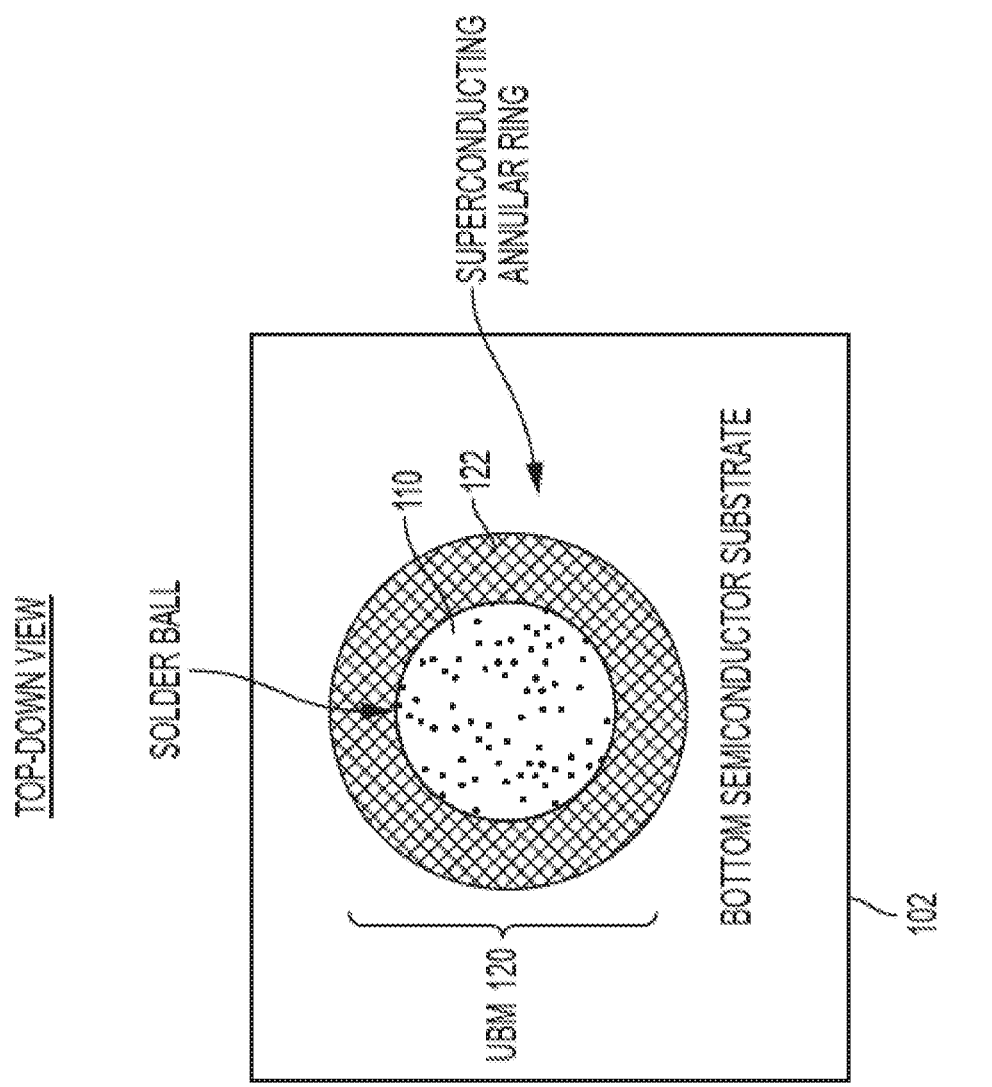
FIG. 5B depicts a top-down view of the UBM structure shown in FIG. 5A.

FIG. 5A depicts a cross-sectional view of the bump/UBM interface 100 after forming the solder ball 110, and FIG. 5B depicts a top-down view of the bump/UBM interface 100 shown in FIG. 5A. The solder ball 110 can be deposited using known methods such as, for example, electroplating, evaporation, sputtering, or injection molding (e.g., using a mask). Also, mold backfill methods can be utilized to deposit the solder ball 110, and other deposition methods are also suitable. The solder ball 110 can be formed from indium/indium-alloys and flux. Also, flip chip bumping technology can be utilized, which melts bulk solder and dispenses the same into a wafer-sized mold, which is CTE matched to the bottom semiconductor wafer 102. After cooling to solidify the solder, the solder is formed the bottom semiconductor substrate 102 in the desired shape. The bottom semiconductor substrate 102 can now be independently subjected to a final solder reflow methodology to obtain spherically shaped solder balls 110.

The heating for the reflow process can be accomplished by passing the bump/UBM structure 100 through a reflow oven or under an infrared lamp or by soldering the bond/solder layer stack with a hot air pencil. The reflow process melts the solder ball 110 and heats the adjoining surfaces without overheating and damaging the electrical components. An exemplary reflow process can include four stages or zones, namely preheat, thermal soak, reflow and cooling, wherein each stage has a distinct thermal profile. An exemplary reflow process is conducted in an acid environment using, for example, formic acid). The acid environment ensures that the solder remains clean during reflow. The post-reflow solder ball 110 is compliant, particularly when the solder ball 110 is indium, which mitigates the impact of CTE mismatches. After the solder is reflowed into a sphere to form the solder balls 110, the solder ball 110 and the bottom semiconductor substrate 102 (including the conductive regions 122) are cleaned using standard procedures to remove oxides.

As shown in FIG. 1 or FIG. 2, the bump/UBM structure 100 is now ready to receive the top semiconductor substrate 104 (e.g., using a chip bonder). A prepared top semiconductor substrate 104 is bonded to the prepared bottom semiconductor substrate 102 using compression bonding. Sufficient force is applied in order to cause the solder ball 110 to deform and contact the annular ring-shaped conductive region 122 (and conductive region 222 in FIG. 2).

Figure 6A:
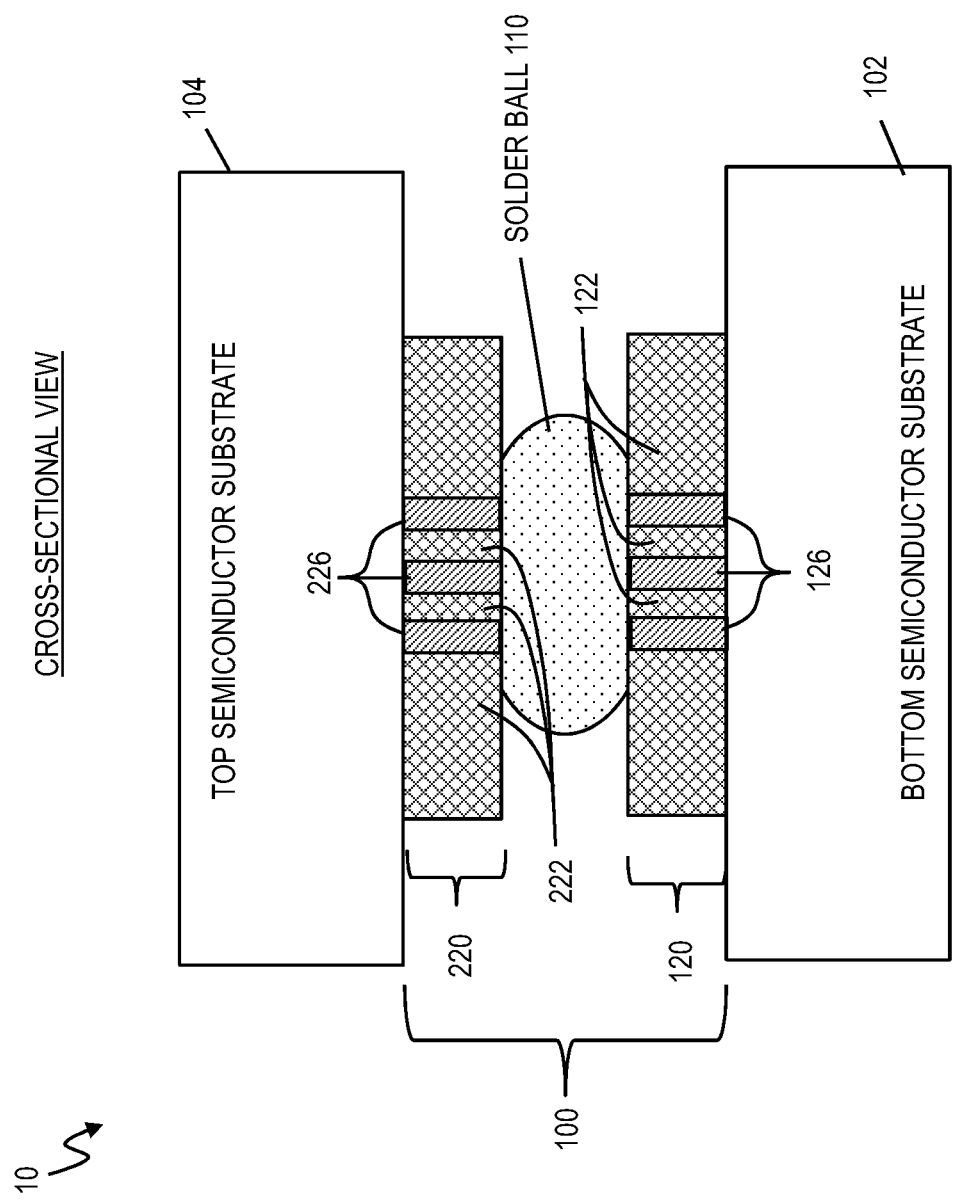
FIG. 6A depicts a cross-sectional view of another two-component UBM structure according to embodiments of the invention.

As noted above, the UBM structures 120 and 220 are not limited to a particular pattern or shape for the conductive regions 122, 222 and bond regions 126, 226. FIG. 6A depicts a cross-sectional view of device 10 which includes another two-component UBM structure 100 according to embodiments of the invention. FIGS. 6A and 6B illustrate that there can be multiple locations for the bond regions 126 and 226 in the UBM structures 120 and 220.

FIG. 6B depicts a top-down view of the bottom/top two-component UBM structures according to embodiments of the invention. FIG. 6B is only a partial view representative of a top view of the UBM structure 120 and representative of the UBM 220 with the solder ball 110 removed.

Also, the top and bottom UBM structures 120 and 220 are illustrated as being the same, it should be appreciated the locations of the bond regions and the locations of the conductive region may not be the same. FIG. 6B shows a checkered pattern of locations for the bond region and the conductive region. It should be appreciated that more or fewer locations for the bond region can be used with more or fewer locations for the conductive region. Further, the locations of bond region and conductive region can be varied shapes and are not limited to circular shapes and rectangular shapes.

Although some materials have been mentioned herein, there are various materials that can be utilized as the bond regions 126, 226 and the conductive regions 122, 222 and the materials can be changed according to the mechanical bonding process. Direct or fusion bonding can be used to bond the solder ball/bump 110 to the UBM structures 120, 220. Direct or fusion bonding is utilized for chemical joining of dielectric and metallic surfaces. This type of process in can include anodic bonding, surface activation/pressure treatment, pressure/heat, ultrasound, laser weld, and an ultrahigh vacuum. Example materials of the bond region 126, 226 can include silicon, silicon oxide, glasses, stainless steel, etc.

Another type of bonding is solder bonding, solder bonding is the joining of wettable surface(s) (such that the material of the bond region 126, 226) with metal or metallic alloys that typically have a liquidus temperature around 300° C. or below. This type of process can include enable wetting of the solder to a wettable surface(s) and applying the solder material can include some combination of mechanical, thermal, pressure and/or chemical processes. Some common process names are reflow, thermocompression bonding, cold-welding, transient liquid phase diffusion bonding, and ultrasonic bonding. Example solder materials can include Pb, Ag, Sn, In, Bi, Ga, Cu, Au, Cd, Zn, and/or combinations thereof. Examples material for wettable surfaces can include Sn, Cu, Cd, Au, Pd, Rh, Ni, Pb, Zn, Ag, Pt, and/or combinations thereof.

Another type of bonding is adhesive bonding. Adhesive bonding is chemically bonding two surfaces together through covalent and/or attractive intermolecular forces such as van der Waals or polar forces. This process is pressure sensitive and can include a drying process and/or a reactive process. Example adhesives can include acrylics, epoxies, silicones, polyimides, urethanes, cyanoacrylates, etc., and common joining surfaces can be almost any material.

Superconductive joints are used for the conductive regions 122, 222. The superconducting joint is comprised entirely of superconducting materials. In one case, a very low resistance joint can be used, in which the superconductive joints can be comprised of superconducting materials, and if designed properly, may contain an insulator with well-defined geometries in conjunction with superconducting materials (such as when forming a Josephson junction). The bonding processes of the superconductive joint is similar to the direct and soldering process discussed above. Example superconducting metallic materials (for the conductive region 122, 222) can include To, V, Nb, La, Zr, Ru, Pb, Os, Sn, Hg, Ga, Al, Cd, Mo, Ta, W, Zn, and/or combinations thereof. Example insulator materials can include metal oxides such as, for example, aluminum oxide.

FIG. 7 depicts a fabrication methodology 700 according to embodiments of the present invention. Fabrication methodology 700 can be used to form the bump/UBM structure 100 shown in FIGS. 1 and 3A to 5B. In block 702, a superconducting metal is deposited on a bottom substrate 102 to form an initial UBM structure 120. In block 704, the initial UBM structure 120 is patterned and etched to form a superconducting region and a non-superconducting region in the UBM structure. In block 706, a non-superconducting metal is deposited in the non-superconducting region 126 of the UBM structure. In block 708, bump material is deposited on the non-superconducting metal in the non-superconducting region 126 of the UBM structure. In block 710, the substrate is cleaned. In block 712, the bump material is reflowed into a sphere. In block 714, the spherical bump and the superconducting metal surface are cleaned to remove oxides. In block 716, a top prepared substrate 104 is bonded to the opposite side of the spherical bump 110 with sufficient force to cause the spherical bump to deform and contact to the superconducting metal in the superconducting region 122 of the UBM structure 120.

FIGS. 8A and 8B depict a fabrication methodology 800 according to embodiments of the present invention. Fabrication methodology 800 can be used to form the bump/UBM structure 100 shown in FIGS. 2 and 6A. FIGS. 8A and 8B are similar to FIG. 7 except for the formation of both UBM structures 120 and 122 are discussed in FIGS. 8A and 8B. In block 802, a superconducting metal is deposited on a bottom substrate 102 to form an initial bottom UBM structure. In block 804, the initial bottom UBM structure 120 is patterned and etched to form a superconducting region and a non-superconducting region in the bottom UBM structure. In block 806, a non-superconducting metal is deposited in the non-superconducting region 126 of the bottom UBM structure 102. In block 808, bump material is deposited on the non-superconducting metal in the non-superconducting region 126 of the bottom UBM structure. In block 810, the bottom substrate is cleaned. In block 812, the bump material 110 is reflowed into a sphere. In block 814, a top substrate 104 is prepared having a top superconducting metal/region 222 and a top non-superconducting/metal region 226 of a top UBM structure 220 (e.g., using operations 802, 804, 806). In block 816, the spherical bump 110 and the top/bottom superconducting metal surfaces are cleaned to remove oxides. In block 818, the top prepared substrate 104 and the bottom prepared substrate 102 are bonded to the opposite sides of the spherical bump 110 with sufficient force to cause the spherical bump to deform and contact to the top and bottom superconducting metal in the top and bottom superconducting regions 122, 222 of the top/bottom UBM structure 120, 220.

FIG. 9 depicts a flow chart 900 of forming a device 10 according to embodiments of the invention. At block 902, an under-bump-metallization (UBM) structure comprises a first region (e.g., conductive 122) and a second region (e.g., bond region 126), and the first and second regions are laterally positioned in the UBM structure (e.g., UBM structure 120). The first region (e.g., conductive 122) includes superconducting material.

At block 904, a substrate (e.g., substrate 104) opposes the UBM structure 120. At block 906, a superconducting solder material 110 joins the first region to the substrate and the second region to the substrate.

The UBM structure (e.g., UBM structure 120) is arranged such that the first region is laterally adjacent to the second region, thereby enabling the superconducting solder material to contact both the first and second regions. The UBM structure (e.g., UBM structure 120) is arranged to have one or more first locations containing the first region (e.g., conductive region 122) and have one or more second locations containing the second region (e.g., bond region 126). The one or more first locations are different from the one or more second locations. The second region (e.g., bond region 126) comprises a non-superconducting material. The substrate (e.g., substrate 102) comprises a superconducting circuit (e.g., superconducting circuit 1102 depicted in FIG. 11) connected to the superconducting solder material (e.g., solder ball 110), such that the first region (e.g., conductive region 122) is electrically connected to the superconducting circuit (e.g., superconducting circuit 1102). A superconducting junction is formed between the superconducting solder material (e.g., solder ball 110) and the first region (e.g., conductive region 122).

FIG. 10 depicts a flow chart 1000 of forming a device 10 according to embodiments of the invention. At block 1002, a first under-bump-metallization (UBM) structure 120 includes a first region (e.g., conductive region 122) and a second region (e.g., bond region 126) wherein the first and second regions are laterally positioned in the first UBM structure (e.g., UBM structure 120). The first UBM structure (e.g., UBM structure 120) is connected to a first substrate (e.g., substrate 102). At block 1004, a second UBM structure (e.g., UBM structure 220) includes another first region (e.g., conductive region 222) and another second region (e.g., bond region 226), where the another first and another second regions are laterally positioned in the second UBM structure (e.g., UBM structure 220). The second UBM structure (e.g., UBM structure 220) is connected to a second substrate (e.g., substrate 104).

At block 1006, a superconducting solder material (e.g., solder bump 110) joins the first region and the second region (e.g., conductive region 122 and bond region 126) of the first UBM structure (e.g., UBM structure 120) to the another first region and another second region (e.g., conductive region 222 and bond region 226) of the second UBM structure (UBM structure 220). The first region and the another first region include superconducting material.

The first UBM structure (UBM structure 120) is arranged such that the first region is laterally adjacent to the second region, thereby enabling the superconducting solder material to contact both the first and second regions. The second UBM structure (e.g., UBM structure 220) is arranged such that the another first region (e.g., conductive region 222) is laterally adjacent to another second region (e.g., bond region 226), thereby enabling the superconducting solder material (e.g., solder bump 110) to contact both the another first and another second regions.

The first UBM structure (UBM structure 120) is arranged to have one or more first locations containing the first region and have one or more second locations containing the second region. The second UBM structure (UBM structure 220) is arranged to have one or more second locations containing the another first region and have one or more second locations containing another second region. The second region and another second region (e.g., bond regions 126 and 226) comprise non-superconducting material.

The first substrate (e.g., substrate 102) comprises a first superconducting circuit (e.g., superconducting circuit 1102) electrically connected to the superconducting solder material (e.g., solder bump 110). The second substrate (e.g., substrate 104) comprises a second superconducting circuit (e.g., superconducting circuit 1104) electrically connected to the superconducting solder material (e.g., solder bump 110), such that the first and second superconducting circuits (e.g., circuits 1102 and 1104) are electrically connected via the first region (e.g., conductive region 122), the another first region (e.g., conductive region 222), and the superconducting solder material (e.g., solder bump 110). A superconducting junction is formed between the superconducting solder material and the first region and between the superconducting solder material and the another first region.

Figure 11:
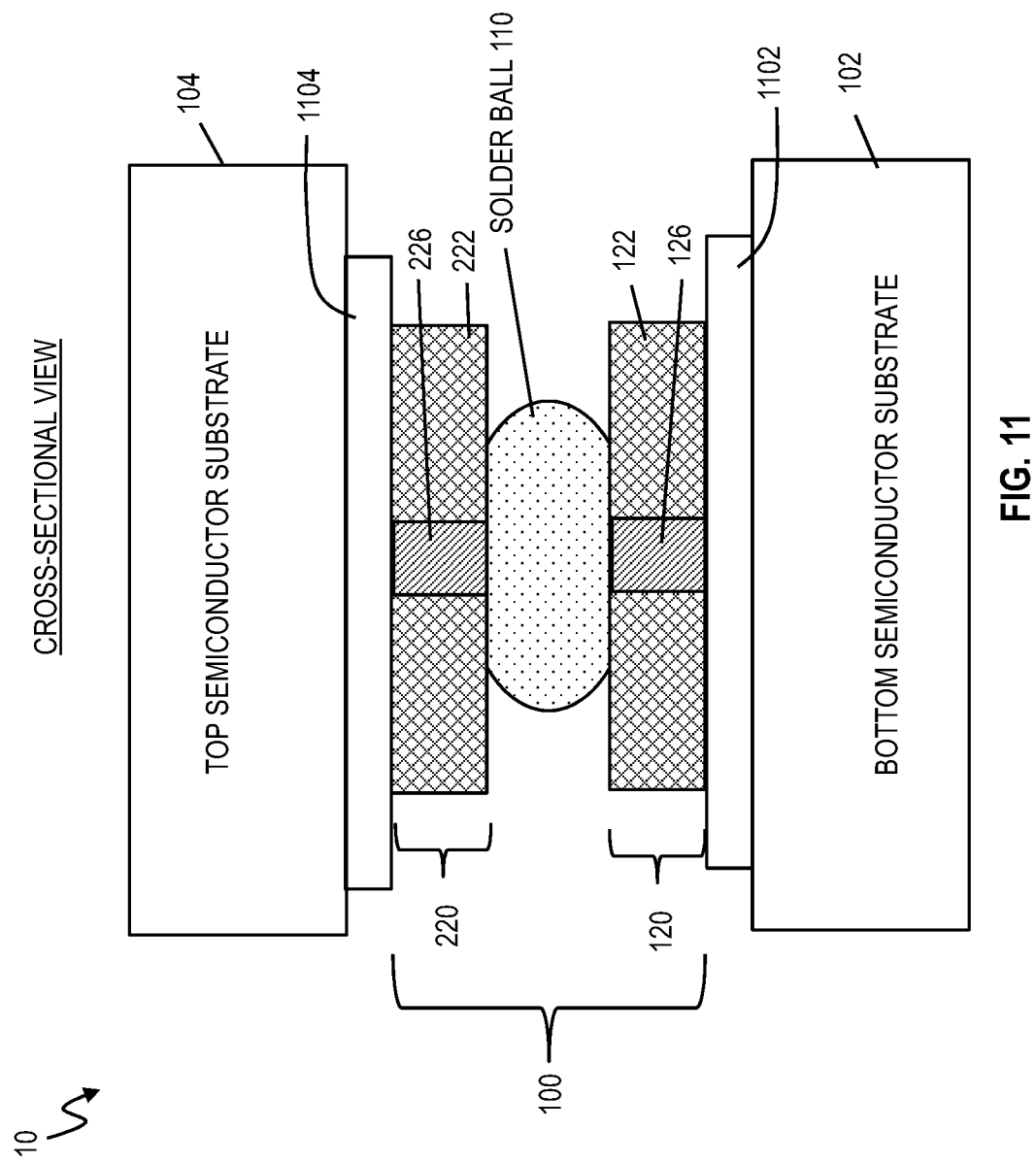
FIG. 11 depicts a cross-sectional view of the device illustrating further details of the substrates according to embodiments of the invention.

FIG. 11 depicts a cross-sectional view of the device 10 illustrating further details of the top semiconductor substrate 104 and the bottom semiconductor substrate 102. The bottom semiconductor substrate 102 includes superconducting circuit 1102 and the top semiconductor substrate 104 includes superconducting circuit 1104. In this example, the superconducting circuits 1102 and 1104 are electrically connected by the solder ball 110, the conductive region 122 and the conductive region 222. In some embodiments of the invention, the top UBM structure 220 may not be present. It should be appreciated that the circuits 1102 and 1104 are not drawn to scale in FIG. 11.

FIG. 12 depicts a system 1200 illustrating a cooling system 1202 and the device 10 according to embodiments of the invention. The device 10 has been placed into the cooling system 1102 and one or more input and output lines 1204 are connected device 10 in the cooling system 1202. The cooling system 1202 can be a cryogenic cooling device, a dilution refrigerator, etc. The device 10 is cooled to superconducting temperatures (low temperatures) that cause that superconducting circuits 1102 and 1104, conductive regions 122 and 222, and the solder balls 110 to become superconducting. Examples of superconducting temperatures can include temperatures below 100 millikelvin (mK), at about 10-100 mK, and/or about 4 K.

Thus, it can be seen from the foregoing detailed description and accompanying illustrations that embodiments of the present invention provide systems, methodologies and resulting UBM structures that are fully superconducting and provide superior mechanical/metallic bonding. According to embodiments of the invention, the UBM includes two components/regions, namely, a bonding component/region and a conductive component/region. The bonding region is electrically coupled and mechanically bonded to a solder bump, and the conductive region is also electrically coupled and mechanically bonded to the solder bump.

According to embodiments of the invention, the mechanical bond provided by the bonding region is superior to the mechanical bond provided by the conductive region. Accordingly, the overall mechanical bond provided by the novel UBM structure (i.e., the conductive region and the bonding region) is a superior mechanical bond. In embodiments of the invention, the mechanical bond provided by the bonding region is improved over the mechanical bond provided by the conductive region by forming the bond region from a material that resists oxidation. Accordingly, in embodiments of the invention, the bond region is formed from a material having a lower level of surface oxidation than the material that forms the conductive region.

According to embodiments of the invention, the electrical coupling provided by the conductive region is superior to the electrical coupling provided by the bonding region. One way to measure electrical coupling is resistance. In embodiments of the invention, the conductive region is formed from materials having lower electrical resistance than the materials that form the bonding region. Accordingly, the overall electrical coupling provided by the novel UBM structure (i.e., the conductive region and the bonding region) is superior, low resistance electrical coupling.

Embodiments of the invention provide novel fabrication methodologies for forming the two-component UBM and attaching the UBM to the bump such that the bump contacts the bonding region and the conductive region of the UBM structure. In embodiments of the invention, the bonding region is formed as a circle to match the spherical contour of the bump, and the conductive region is formed as an annular ring around the circular bonding region. During fabrication, initial contact is made between the bump and the circular bonding region, and the bump is subsequently compressed (e.g., during a thermo-compression bonding operation) using sufficient force to cause the bump to deform against the two-component UBM structure enough that the bump/UBM interface, in effect, spreads out, and the deformed bump comes into contact with the annular ring-shaped conductive region of the UBM structure. In embodiments of the invention, the circular bonding region is thinner than the annular ring-shaped conduction region in order to reduce the amount of force needed to bring the deformed bump into contact with the annular ring-shaped conductive region.

As previously noted herein, for the sake of brevity, conventional techniques related to semiconductor device and IC fabrication may or may not have been described in detail. By way of background, however, a more general description of the semiconductor device fabrication processes that can be utilized in implementing embodiments of the present invention will now be provided. Although specific fabrication operations used in implementing embodiments of the present invention may or may not be individually known, the disclosed combination of operations and/or resulting structures of the embodiments of the present invention are unique. Thus, the unique combination of the operations described in connection with the fabrication of a coupler system according to embodiments of the present invention utilize a variety of individually known physical and chemical processes performed on a semiconductor (e.g., silicon) substrate.

In general, the various processes used to form a microchip that will be packaged into an IC fall into three categories, namely, film deposition, patterning, etching and semiconductor doping. Films of both conductors (e.g., polysilicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Fundamental to all of the above-described fabrication processes is semiconductor lithography, i.e., the formation of three-dimensional relief images or patterns on the semiconductor substrate for subsequent transfer of the pattern to the substrate. In semiconductor lithography, the patterns are a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The corresponding structures, materials, acts, and equivalents of all means or step plus function elements in the claims below are intended to include any structure, material, or act for performing the function in combination with other claimed elements as specifically claimed. The described embodiments of the present invention has been presented for purposes of illustration and description, but is not intended to be exhaustive or limited to the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

The term "exemplary" is used herein to mean "serving as an example, instance, or illustration." Any embodiment or design described herein as "exemplary" is not necessarily to be construed as preferred or advantageous over other embodiments or designs. The terms "at least one" and "one or more" can include any integer number greater than or equal to one, i.e. one, two, three, four, etc. The terms "a plurality" can include any integer number greater than or equal to two, i.e. two, three, four, five, etc. The term "connection" can include both an indirect "connection" and a direct "connection."

The flowchart and block diagrams in the figures illustrate the functionality and operation of possible implementations of systems and methods according to various embodiments of the present invention. In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. The actions can be performed in a differing order or actions can be added, deleted or modified. Also, the term "coupled" describes having a signal path between two elements and does not imply a direct connection between the elements with no intervening elements/connections therebetween. All of these variations are considered a part of the invention.

The terms "about," "substantially" and equivalents thereof are intended to include the degree of error associated with measurement of the particular quantity based upon the equipment available at the time of filing the application. For example, "about," "substantially" and equivalents thereof can include a range of ±8% or 5%, or 2% of a given value.

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present invention has been described in detail in connection with only a limited number of embodiments, it should be readily understood that the present invention is not limited to such disclosed embodiments. Rather, the present invention can be modified to incorporate any number of variations, alterations, substitutions or equivalent arrangements not heretofore described, but which are commensurate with the spirit and scope of the present invention. Additionally, while various embodiments of the present invention have been described, it is to be understood that aspects of the present invention can include only some of the described embodiments. Accordingly, the present invention is not to be seen as limited by the foregoing description, but is only limited by the scope of the appended claims.

What is claimed is:

1. A structure, comprising:
    an under-bump metallization (UBM) structure comprising a bonding region laterally surrounded by a superconducting region; and
    a superconducting solder material joining the UBM structure to a substrate.

2. The structure of claim 1, wherein the bonding region comprises a non-oxidizing metal.

3. The structure of claim 1, wherein the superconducting region is an annular ring that circumferentially surrounds the bonding region.

4. The structure of claim 1, wherein the bonding region has a lower level of surface oxidation than the superconducting region.

5. The structure of claim 1, wherein the bonding region has a higher enthalpy of vaporization than the superconducting region.

6. The structure of claim 1, wherein the bonding region is selected from a group consisting of: titanium; palladium or gold.

7. The structure of claim 1, wherein the superconducting region has greater electrical coupling than the bonding region.

8. The structure of claim 1, wherein the superconducting region is selected from a group consisting of: titanium nitride, tantalum or aluminum.

9. A structure, comprising:
    a first substrate bonded to a first under-bump metallization (UBM) structure, the first UBM structure comprising a first bonding region laterally surrounded by a first superconducting region;
    a second substrate bonded to a second under-bump metallization (UBM) structure, the second UBM structure comprising a second bonding region laterally surrounded by a second superconducting region; and
    a superconducting solder material joining the first UBM structure to the second UBM structure.

10. The structure of claim 9, wherein at least one of the first or second bonding regions comprises a non-oxidizing metal.

11. The structure of claim 9, wherein at least one of the first or second superconducting regions is an annular ring that circumferentially surrounds respectively at least one of the first or second bonding regions.

12. The structure of claim 9, wherein the first bonding region has a lower level of surface oxidation than the first superconducting region.

13. The structure of claim 9, wherein the first bonding region has a higher enthalpy of vaporization than the first superconducting region.

14. The structure of claim 9, wherein the first bonding region is selected from a group consisting of: titanium; palladium or gold.

15. The structure of claim 9, wherein the first superconducting region has greater electrical coupling than the first bonding region.

16. The structure of claim 9, wherein the first superconducting region is selected from a group consisting of: titanium nitride, tantalum or aluminum.

17. A method, comprising:
forming a first under-bump metallization (UBM) structure by:
depositing a superconducting metal on a substrate;
patterning and etching the superconducting metal to form a superconducting region and a non-superconducting region; and
depositing a non-superconducting metal in the non-superconducting region;
depositing a bump material on the non-superconducting metal of the non-superconducting region;
reflowing the deposited bump material into a spherical bump; and
bonding the first UBM structure to a second UBM structure such that the spherical bump deforms and contacts respective superconducting metals of superconducting regions of the first and second UBM structures.

18. The method of claim 17 further comprising cleaning surfaces of the superconducting metals of the first and second UBM structures to remove oxides.

19. The method of claim 17, wherein the patterning and etching of the superconducting metal forms a superconducting annular ring, and the non-superconducting metal deposited in the non-superconducting region is circumferentially surrounded by the superconducting annular ring.

20. The method of claim 17, wherein the bump material is a superconducting solder material.

* * * * *